United States Patent [19]

Chaudhari et al.

[11] 4,052,709

[45] Oct. 4, 1977

[54] ACCESSING INFORMATION IN A LATTICE ARRAY BY DISLOCATION PUNCHING

[75] Inventors: Praveen Chaudhari, Briarcliff Manor; Geoffrey Richard Woolhouse, Montrose, both of N.Y.

[73] Assignee: International Business Machines Corporation, Armonk, N.Y.

[21] Appl. No.: 608,366

[22] Filed: Aug. 27, 1975

[51] Int. Cl.² .............................................. G11C 11/02
[52] U.S. Cl. ....................... 340/174 TF; 340/174 AA; 340/174 SR
[58] Field of Search .................. 340/174 AA, 174 TF, 340/174 SR, 174 CH

[56] References Cited

U.S. PATENT DOCUMENTS

| 3,803,591 | 4/1974 | Watanabe et al. | 340/174 TF |
| 3,863,234 | 1/1975 | Semon et al. | 340/174 TF |
| 3,921,155 | 11/1975 | Minnick et al. | 340/174 TF |
| 3,930,244 | 12/1975 | Voegeli | 340/174 TF |

Primary Examiner—Marshall M. Curtis

Attorney, Agent, or Firm—Sughrue, Rothwell, Mion, Zinn and Macpeak

[57] ABSTRACT

A string of bubble domains having a length equal to that of a column portion to be extracted from a bubble domain lattice array is laterally punched into the input side of the array at the height of the desired column portion. As it enters the array it displaces the adjacent and corresponding portion of the first column, which thus becomes a dislocation dipole. The latter is then propagated through the array by subsequent punching cycles until the corresponding portion of the last column is forced out of the array. At this point the dislocation dipole has passed completely through the array, and the corresponding portions of each column have been displaced one column to the right. The process is then repeated until the desired column portion has been displaced across the array into the last column, and then forced out of the array for reading. By punching the forced out column portions back into the array at the input side the original storage order of the array can be reestablished.

12 Claims, 7 Drawing Figures

ACCESSING INFORMATION IN A LATTICE ARRAY BY DISLOCATION PUNCHING

BACKGROUND OF THE INVENTION

1. Field of the Invention

This invention relates to a method and apparatus for accessing data in a lattice array storage device. It is particularly, but not exclusively, adapted to be used in connection with such an array wherein data storage is implemented by magnetic bubble domains. The proper classification for the subject matter of this invention is believed to be Class 340, Subclass 174TF.

2. Description of the Prior Art

A recent development in the relatively new field of technology wherein magnetic bubble domains are used for the storage and manipulation of data has been the orderly arrangement of such bubble domains in a confined lattice array. Such an array may be generally likened to a crystaline lattice structure, and is characterized by the bubble domains being so closely packed that the interactions between them, i.e., the forces of repulsion since they all have the same magnetic orientation, cause their orderly arrangement in a hexagonal configuration wherein each bubble domain has six nearest neighbors. The outline or boundary of the array has the shape of a 60° rhombus. The bubble domains may be coded in a number of ways to represent information or data bits, and they may be manipulated in various ways to implement data processing functions. A system using a lattice storage device of this type is disclosed in co-pending application Ser. No. 395,336 filed Sept. 7, 1973, now abandoned in favor of continuation application Ser. No. 632,604 filed Nov. 14, 1975. It was also described in a series of technical papers presented at the 20th annual conference on magnetism and Magnetic Materials which was held in San Francisco, Calif., Dec. 3-6, 1974.

One of the problems associated with lattice arrays is the accessing of the data stored therein, and its extraction for reading and processing purposes. The magnitude of the problem may be readily appreciated when it is considered that the diameter of an individual bubble domain may be less than 1 micron, the data word desired may lie in the central area of the array, and if it is somehow simply lifted out or removed in situ the surrounding bubble domains will close in to fill the void and thus destroy the storage order of the array.

The accessing technique employed in the above mentioned application involves the translation of the desired data column across the array until it reaches the reading position at the output side of the array. The earlier columns that precede it are read out and reinserted at the input side. This amounts to "revolving" the entire storage file, and can be very time consuming unless the desired column handly happens to be proximate the output side of the array.

Another accessing technique employed for lattice arrays is disclosed in co-pending application Ser. No. 429,601 filed Jan. 2, 1974. In this application a plurality of columnar aligned read-write stations are spaced along opposite edges of the lattice array, and buffer regions are provided adjacent to the other set of opposing edges. To access a desired column it need only be translated to the nearest read-write location, where it is then serially pumped out of the array in a direction transverse to the translation direction. Array disturbances caused by the limited translational movements are absorbed in the buffer regions. The column of bubbles which has been read out may be reinserted into its original position in the array through the accessed write station, to thus restore the storage order of the array. While this technique reduces the access time it does so at the expense of increased hardware requirements, since clearly the greater the number of read-write stations the lower the average access time and the worst case access time.

SUMMARY OF THE INVENTION

According to the present invention a totally new accessing concept for information stored in lattice arrays is proposed which effectively overcomes the disadvantages attendant to the prior art techniques discussed above. This new concept draws on, inter alia, the knowledge gained from studies of real crystaline structures wherein deformations are achieved by the movement of dislocations, which may be broadly described as imperfections in an otherwise perfect geometrical array.

Basically, if it is desired to access and extract a data work represented by a series of adjacent bubble domains stored in a given column in a lattice array, a string of bubble domains having the same length as the data word is positioned at the input side of the array at the same height as the data word, i.e., adjacent the same rows occupied by the bubble domains of the data word. The string is then magnetically punched into the array in parallel, and as it enters the first column it displaces the corresponding bubble domains thereof to a position between the first and second columns. The displaced bubble domains then constitute what is termed herein a dislocation dipole, in the sense that they represent an elongated imperfection in the normal, perfectly ordered geometry of the array.

The dislocation dipole is thereafter laterally propagated across the array towards the output side, along the same rows, by subsequent punching cycles until the corresponding bubble domains of the last column have been forced out of the array for reading. At this stage the dislocation dipole has travelled completely across the array, and the corresponding bubble domains of each column have been displaced one column to the right, or toward the output side. The string of bubble domains forced out from the last column is then recirculated back to the input side, or regenerated thereat, and punched back into the array at the addressed row positions, and the process is repeated until the desired data word is ultimately expelled from the array for read out.

This dislocation dipole punching technique may be implemented by generating a full column of bubble domains at the input side of the array, and then punching in only a desired portion of the column by pulsing selectively accessed rungs of an adjacent ladder configuration. Alternatively, a portion of a full column of bubble domains may be moved into position at the input side of the array by stepping it through a shift register. When this portion has reached the desired height it is laterally punched into the array by pulsing an adjacent conductor strip.

DESCRIPTION OF THE PREFERRED EMBODIMENT

Figure 1A:
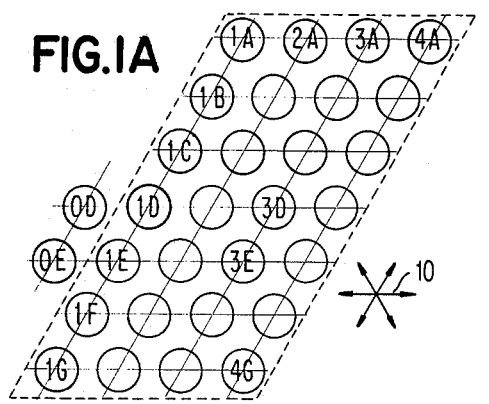
FIGS. 1A – 1E show simplified plan views of a bubble domain lattice array sequentially illustrating the creation and propagation of a dislocation dipole through the array.

Referring now to the drawings, FIG. 1A shows a plan view of a lattice array of magnetic bubble domains perfectly arranged in a natural rhombic configuration with seven rows A – G and four columns 1 – 4. Virtually all of the necessary supporting structure has been omitted in the interests of simplicity, including input means, output means, recirculators, bubble generators, bubble quenchers or busters, sensing means, boundary confinement means for the array, field generators, etc. This structure is all well known in the art, however, as exemplified by co-pending application Ser. No. 359,336 referenced above, forms no part of the present invention, and is not necessary for an understanding thereof. It will also be appreciated that while the illustrated array is unrealistically small from a practical standpoint in terms of the numbers of rows and columns, it is sufficient to fulfill its purpose of enabling an understanding of the invention.

Suppose now, for example, that it is desired to access and read out the two bit data word represented by bubble domains 3D and 3E. According to the invention a string of bubble domains equal in length to the desired data word is positioned at the left hand or input side of the lattice array at the same row height as the desired word. In this simple example only two bubble domains OD and OE are involved, positioned as shown. Next, these two bubble domains are pressed or punched into the array in the direction of arrow 10 in FIG. 1A by generating a brief magnetic force vector in that direction. The means for generating this vector will be described below.

It should also be mentioned that the arrow configuration 10 in FIG. 1A represents the six "close packed directions" of the array. These are the directions in which bubble domains in a 60° rhombic array are most easily moved or displaced with a minimum amount of (magnetic) force.

Figure 1B:
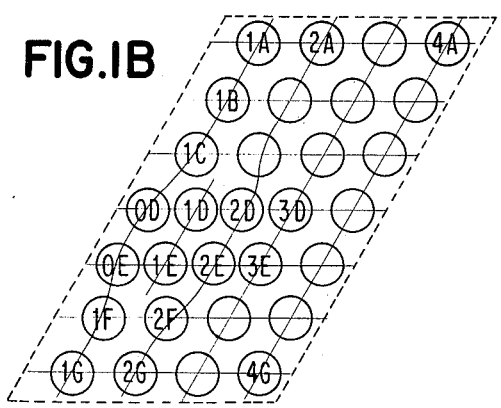

As bubble domains OD and OE enter column 1 of the array they displace the corresponding bubble domains ID and IE, which assume a position mid-way between columns 1 and 2 as shown in FIG. 1B. Bubble domains 1D and 1E thus constitute a dislocation dipole two bits or two bubble domains in length. The lattice array readjusts itself slightly to accommodate the dislocation, as seen by the bulges in columns 1 and 2. In actual practice columns 3 and 4 would also bulge or bend to a respectively decreasing extent, but this has not been shown in the interest of simplicity.

Figure 1C:
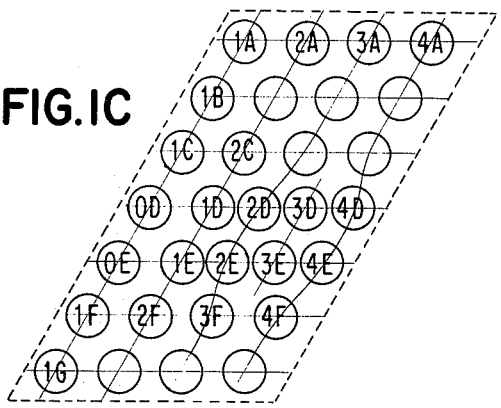
Figure 1D:
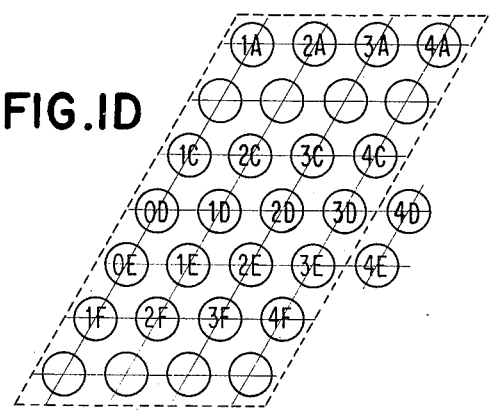

Upon the generation of each subsequent punching vector the dislocation dipole is laterally propagated across rows D and E of the array one column to the right. As the dipole enters a column it pushes out the D and E bubble domains of the column, which then become a new dislocation dipole. After a total of three punching vectors the array appears as shown in FIG. 1C, with the ultimately desired bubble domains 3D and 3E themselves constituting a dislocation dipole. When the fourth punching vector is applied the bubble domains 3D and 3E enter the last or output side column, as shown in FIG. 1D. This expells bubble domains 4D and 4E from the array to a reading station, not shown. At this stage the dislocation dipole has entered, propagated completely across, and exited the array, and the bubble domains of rows D and E have been displaced one column to the right.

Figure 1E:
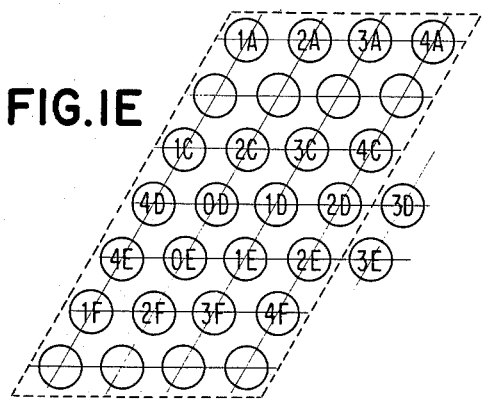

The expelled bubble domains 4D and 4E may be recirculated back to, or regenerated at, the input side of the array and punched in as were bubble domains OD and OE. The application of three more punching vectors repeats the cycle of FIGS. 1A – 1D to ultimately expell the desired bubble domains 3D and 3E, as shown in FIG. 1E.

To reestablish the original storage order of the array the recirculation process described above is simply continued until bubble domains OD and OE have travelled completely across and been expelled from the array.

Figure 2:
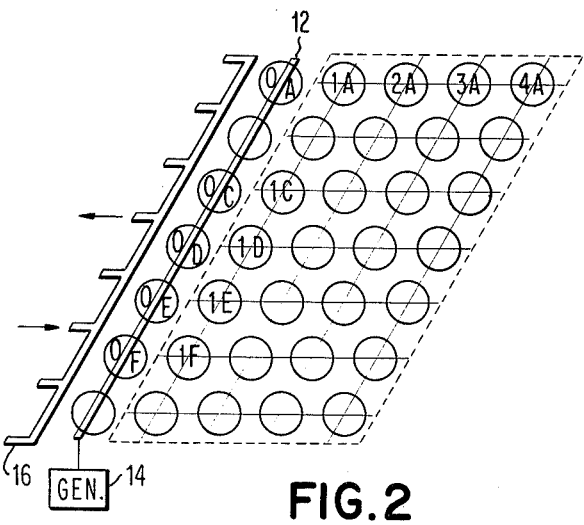
FIG. 2 shows one structural implementation of dislocation dipole generation and punching.

The dislocation dipole creation and punching can be implemented in a number of ways, two of which will now be described. Referring to FIG. 2, a strip conductor 12 of Permalloy (a trademark of the Allegheny Ludlum Corp.) or the like is laid down on the bubble domain supporting substrate or platelet adjacent to the input side of the array and parallel to column 1. The conductor is supplied with bubble domains from a generator 14 until they achieve a density or spacing equal to that of the array. This may be further implemented by widening the conductor 12 at the row positions. Adjacent the conductor 12 is a ladder rung pattern 16, also of Permalloy or the like. To generate a punching vector across rows D and E of the array it is only necessary to address the rungs that flank or bracket these rows and send a current pulse through the included columnar portion of the ladder, as indicated by the arrows in FIG. 2. By localizing the field in this manner only bubble domains OD and OE are punched into the array, and the remaining bubble domains under the conductor 12 are not disturbed. The dislocation dipole thus created may be propagated across the array by repeatedly pulsing the addressed rungs, assuming the OD and OE positions on conductor 12 remain vacant. Alternatively, conductor 12 may be emptied of bubble domains and the upper and lower rungs addressed. This may be more effective when the array is relatively wide.

The parameters of the punching vectors have not been developed in detail as they may be easily determined by someone skilled in the art as a function of, inter alia, the physical dimensions of the array, the bubble packing density, the mobility of the bubbles, etc. Suffice to state that the magnitude of the vectors must be large enough to cause a one column propagation of the dislocation being laterally translated across the array but not so large as to cause any unwanted disturbances or disruption in the array.

Figure 3:
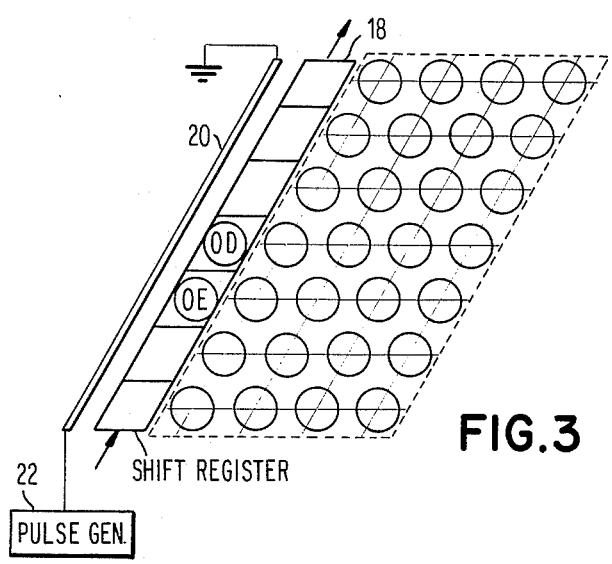
FIG. 3 shows an alternate structural implementation thereof.

In the arrangement shown in FIG. 3 a schematically illustrated shift register 18 is placed at the "column O" position, and a strip conductor 20 fed by a gated pulse generator 22 is laid down alongside it. If a column portion occupying rows D and E is to be extracted, two bubble domains are entered into the register 18 and stepped up to the OD and OE positions. Conductor 20 is then pulsed to punch the pre-positioned bubble domains into the array. Since the other register stages are empty it is not necessary to generate a localized punching vector, as in the FIG. 2 embodiment.

A number of familiar, every day analogies exist which facilitate the envisaging of the concept of the invention. For example, if a new area rug is laid down in a bare room and it is desired to move the entire rug a slight distance toward one wall, a kink or ripple is first formed in the rug adjacent the opposite wall. The ripple is then kicked or worked across the rug in a foot shuffling manner, with the final result that the entire rug is moved a distance approximately equal to twice the height of the ripple. A further example is the brushing out of an air bubble or pocket that forms when pasting up a strip of wallpaper. In both instances the kink and the air bubble may be likened to laterally propagated dislocations.

A dislocation dipole may thus be considered as a temporary, artificially introduced disruption to the ordered symmetry of the array. Once it has been propagated across and out of the array, the original symmetry of the array is inherently and automatically restored.

Dislocation mobility is also the mechanism by which metals and other crystaline structured materials are permanently bent or deformed when stretched boyond their elastic limits. For a fuller development of dislocation theory and phenomenon, reference is made to the following publications:
 a. Proceedings Of The Royal Society, A, Volume 190, page 474 (1947), "A Dynamical Model Of A Crystal Structure" by Bragg and Nye.
 b. The Structure And Properties Of Materials, Volume 1-Structure, Wiley (1965), page 84, authors - Moffatt, Pearsall and Wulff.
 c. The Structure And Properties Of Materials, Volume 3-Mechanical Behavior, Wiley (1965), page 70, authors-Hayden, Moffatt and Wulff.

What is claimed is:

1. A method of accessing and moving at least a columnar portion of information from a magnetic bubble domain lattice array arranged in rows and columns and having a substantially perfect geometrical order, comprising:
 a. establishing an elongated dislocation in the lattice array at the same row height as the desired columnar portion, and
 b. propagating the dislocation across the array toward the desired columnar portion to thus displace the corresponding columnar portions of each column by one column in the direction of propagation and expel the corresponding columnar portion of the last column in the direction of propagation from the array.

2. A method as defined in claim 1 wherein the array has an input side and an opposite, output side, and the dislocation is established by:
 a. positioning a string of bubble domains equal in number of the number of bubble domains in the desired columnar portion at the input side of the array at the same row height as the desired columnar portion, and
 b. magnetically punching the string of bubble domains into the first column of the array, to thereby displace the corresponding bubble domains of the first column to a position substantially mid-way between the first and second columns, whereby the displaced bubble domains constitute a dislocation.

3. A method as defined in claim 1 wherein the dislocation is propagated by generating a magnetic field of relatively short duration and high intensity in the vicinity of the dislocation and on the side thereof opposite from the desired columnar portion, said field having a magnetic orientation substantially the same as that of the dislocation.

4. A method as defined in claim 2 wherein the dislocation is propagated by generating a magnetic field of relatively short duration and high intensity in the vicinity of the dislocation and on the side thereof opposite from the desired columnar portion, said field having a magnetic orientation substantially the same as that of the dislocation.

5. A method of accessing and extracting at least a columnar portion of information from a magnetic bubble domain lattice array arranged in rows and columns and having a substantially perfect geometrical order, comprising:
 a. establishing an elongated dislocation in the lattice array at the same row height as the desired columnar portion,
 b. propagating the dislocation completely across the array toward the desired columnar portion to thus displace the corresponding columnar portions of each column one column to the right in the direction of propagation and expel the corresponding columnar portion of the last column in the direction of propagation from the array, and
 c. repeating steps a) and b) until the desired columnar portion has been expelled from the array.

6. A method as defined in claim 5 further including the steps of:
 a. regenerating the columnar portions expelled from the array at the input side thereof,
 b. magnetically punching the regenerated portions into the array at their original row positions, and
 c. propagating the regenerated portions across the array to their original column positions, to thereby reestablish the original storage order of the array.

7. An apparatus for accessing and extracting at least a columnar portion of information from a magnetic bubble domain lattice array arranged in rows and columns and having a substantially perfect geometrical order, comprising:
 a. means for establishing an elongated dislocation in the lattice array at the same row height as the desired columnar portion, and
 b. means for propagating the dislocation across the array toward the desired columnar portion to thus displace the corresponding columnar portions of each column one column to the right in the direction of propagation and expel the corresponding columnar portion of the last column in the direction of propagation from the array, whereby the repeated establishment and propagation of such dislocations will ultimately expel the desired columnar portion from the array.

8. An apparatus as defined in claim 7 wherein the array has an input side and an opposite, output side, and the means for establishing the dislocation comprises:
 a. means for positioning a string of bubble domains equal in number to the number of bubble domains in the desired columnar portion at the input side of the array at the same row height as the desired columnar portion, and
 b. means for magnetically punching the string of bubble domains into the first column of the array, to thereby displace the corresponding bubble domains of the first column to a position substantially midway between the first and second columns, whereby the displaced bubble domains constitute a dislocation.

9. An apparatus as defined in claim 8 wherein the means for positioning comprises:

a. a magnetically soft strip positioned adjacent the input side of the array substantially parallel to the first column thereof, and b. bubble domain generating means operatively positioned proximate one end of said strip.

10. An apparatus as defined in claim 9 wherein the means for magnetically punching comprises a current conductive ladder configuration positioned adjacent said strip and including a straight portion substantially parallel to said strip and a plurality of rung members extending out from one side of said straight portion.

11. An apparatus as defined in claim 8 wherein the means for positioning comprises:

a. a bubble domain shift register positioned adjacent the input side of the array substantially parallel to the first column thereof, and b. bubble domain generating means operatively positioned proximate one end of said register.

12. An apparatus as defined in claim 11 wherein the means for magnetically punching comprises:

a. a current conductive strip positioned adjacent and parallel to said shift register, and b. a pulse generator coupled to one end of said strip.

* * * * *